United States Patent
Hayashi et al.

(10) Patent No.: US 10,388,624 B2
(45) Date of Patent: Aug. 20, 2019

(54) ANISOTROPIC CONDUCTIVE FILM AND CONNECTION STRUCTURE

(71) Applicant: DEXERIALS CORPORATION, Tokyo (JP)

(72) Inventors: Shinichi Hayashi, Utsunomiya (JP); Masao Saito, Sano (JP); Yasushi Akutsu, Utsunomiya (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/571,241

(22) PCT Filed: May 27, 2016

(86) PCT No.: PCT/JP2016/065778
§ 371 (c)(1),
(2) Date: Nov. 1, 2017

(87) PCT Pub. No.: WO2016/190424
PCT Pub. Date: Dec. 1, 2016

(65) Prior Publication Data
US 2018/0277505 A1  Sep. 27, 2018

(30) Foreign Application Priority Data

May 27, 2015  (JP) .................................. 2015-120626
May 28, 2015  (JP) .................................. 2015-108787

(51) Int. Cl.
*H01L 23/00* (2006.01)
*C09J 7/20* (2018.01)
(Continued)

(52) U.S. Cl.
CPC ................ *H01L 24/29* (2013.01); *C09J 7/10* (2018.01); *C09J 7/20* (2018.01); *C09J 9/02* (2013.01);
(Continued)

(58) Field of Classification Search
CPC .......... H01L 24/29; H01L 2224/29291; H01L 2224/293; H01L 2224/29076; C09J 9/02;
(Continued)

(56) References Cited

FOREIGN PATENT DOCUMENTS

JP   H05-82199 A    4/1993
JP   H09-320345 A   12/1997
(Continued)

OTHER PUBLICATIONS

Nov. 28, 2017 International Preliminary Report on Patentability issued in International Patent Application No. PCT/JP2016/065778.
(Continued)

*Primary Examiner* — Selim U Ahmed
(74) *Attorney, Agent, or Firm* — Oliff PLC

(57) ABSTRACT

An anisotropic conductive film includes an insulating adhesive layer and conductive particles disposed thereon. Arrangement axes of the conductive particles having a particle pitch extend in a widthwise direction of the film, and the axes are sequentially arranged with an axis pitch in a lengthwise direction of the film. The particle pitch, axis pitch of the axes, and an angle θ of the axes relative the widthwise direction of the film are determined according to external shapes of terminals so 3 to 40 conductive particles are present on each terminal when a terminal arrangement region of an electronic component is superimposed on the film so a lengthwise direction of each terminal is aligned with the widthwise direction of the film. By using the film, stable connection reliability is obtained and an excessive
(Continued)

increase in the density of the conductive particles is suppressed even in the connection of fine pitches.

10 Claims, 12 Drawing Sheets

(51) Int. Cl.
*C09J 7/10* (2018.01)
*C09J 9/02* (2006.01)
*C08K 3/36* (2006.01)
*C09J 163/00* (2006.01)

(52) U.S. Cl.
CPC .......... *C08K 3/36* (2013.01); *C08K 2201/001* (2013.01); *C09J 163/00* (2013.01); *C09J 2201/602* (2013.01); *C09J 2203/326* (2013.01); *C09J 2205/102* (2013.01); *C09J 2463/00* (2013.01); *C09J 2471/00* (2013.01); *H01L 2224/293* (2013.01); *H01L 2224/29076* (2013.01); *H01L 2224/29291* (2013.01)

(58) Field of Classification Search
CPC .. C09J 7/10; C09J 2205/102; C09J 2201/602; C09J 2471/00; C09J 2463/00; C09J 2203/326; C09J 163/00; C08K 2201/001
See application file for complete search history.

(56) References Cited

FOREIGN PATENT DOCUMENTS

| | | |
|---|---|---|
| JP | 2007-080522 A | 3/2007 |
| JP | 4887700 B2 | 2/2012 |

OTHER PUBLICATIONS

Aug. 23, 2016 Search Report issued in International Patent Application No. PCT/JP2016/065778.

Nov. 15, 2018 Office Action issued in Korean Patent Application No. 10-2017-7032182.

ANISOTROPIC CONDUCTIVE FILM AND CONNECTION STRUCTURE

TECHNICAL FIELD

The present invention relates to an anisotropic conductive film and a connection structure connected with the anisotropic conductive film.

BACKGROUND ART

Anisotropic conductive films are widely used when an electronic component, such as an IC chip, is mounted on a substrate. In recent years, there has been a demand to increase the density of wiring in small electronic devices such as mobile phones or laptop computers. As a method for adapting anisotropic conductive films to such higher density, a technique in which conductive particles are disposed evenly in a lattice shape over an insulating adhesive layer of an anisotropic conductive film has been known in the art.

However, even when the conductive particles are disposed evenly, connection resistance disadvantageously varies. This is because the conductive particles positioned on an edge of a terminal before anisotropic conductive connection flow off into a space due to the melting of an insulating adhesive and such conductive particles are less likely to be interposed between upper and lower terminals. To address such a problem, setting a first arrangement direction of conductive particles to a lengthwise direction of an anisotropic conductive film and setting a second arrangement direction, which intersects with the first arrangement direction, so as to incline at 5° or more and 15° or less with respect to a direction perpendicular to the lengthwise direction of the anisotropic conductive film have been proposed (Patent Literature 1).

CITATION LIST

Patent Literature

Patent Literature 1: Japanese Patent No. 4887700

SUMMARY OF INVENTION

Technical Problem

However, when a terminal size of an electronic component to be connected with the anisotropic conductive film is further reduced, the number of conductive particles that can be captured by such a terminal is further decreased. Thus, there have been cases where a sufficient level of conduction reliability cannot be obtained with the anisotropic conductive film described in Patent Literature 1. In what is called chip on glass (COG) connection for connecting a control IC in a liquid crystal display, for example, and a transparent electrode on a glass substrate, in particular, terminals have a reduced size due to an increase in the number of terminals accompanied by enhancement in the definition of the liquid crystal display and the miniaturization of the IC chip. Also in film on glass (FOG) connection for connecting a glass substrate for a television display and a flexible printed circuit (FPC), terminals have a fine pitch. Thus, increasing the number of conductive particles that can be captured by a terminal has been a challenge in order to improve the connection reliability.

For this challenge, increasing the density of conductive particles in an anisotropic conductive film is conceivable as a method for increasing the number of conductive particles that can be captured by a terminal. However, when the density of conductive particles is increased in an anisotropic conductive film, the production cost of the anisotropic conductive film is disadvantageously increased.

Moreover, when the number of conductive particles captured by a terminal is excessively increased, pressing force required for pressing such terminals upon anisotropic conductive connection becomes too high along with an increase in the number of terminals due to the implementation of a finer pitch. It is therefore difficult for a conventional connection device to perform fine anisotropic conductive connection. Accordingly, a cost to introduce, or make improvements for, a device adapted to such an increase in pressing force is disadvantageously required.

In view of the above, it is an object of the present invention to obtain stable connection reliability with an anisotropic conductive film even in FOG connection or COG connection of fine pitches, to suppress an increase in the production cost of the anisotropic conductive film due to an increase in the density of conductive particles, and to enable anisotropic conductive connection with conventional equipment.

Solution to Problem

The present inventors have found out that by using an anisotropic conductive film in which arrangement axes, obtained by arranging conductive particles with a predetermined particle pitch, are sequentially arranged in a lengthwise direction of the anisotropic conductive film, and by determining the particle pitch in the arrangement axes of the conductive particles, an axis pitch of the arrangement axes, and an angle of the arrangement axes relative to a widthwise direction of the film (hereinafter referred to as an inclination angle of the arrangement axes) according to external shapes of terminals such that 3 to 40 conductive particles are positioned on each terminal when the widthwise direction of the anisotropic conductive film is aligned with a lengthwise direction of the terminals of an electronic component, the number of conductive particles having no contribution to connection can be decreased while ensuring a sufficient level of conduction reliability and have found out that the number of conductive particles having no contribution to connection can be decreased while ensuring a sufficient level of conduction reliability also when a predetermined number of conductive particles are present in a region with a predetermined area, arrangement axes of the conductive particles in the region are inclined in a widthwise direction of an anisotropic conductive film, and such a region is repeatedly provided in the lengthwise direction of the anisotropic conductive film. The present inventors have thus arrived at the present invention.

More specifically, there is provided an anisotropic conductive film including an insulating adhesive layer, and conductive particles disposed on the insulating adhesive layer. Arrangement axes of the conductive particles having a predetermined particle pitch extend in approximately a widthwise direction of the anisotropic conductive film, and the arrangement axes are sequentially arranged with a predetermined axis pitch in a lengthwise direction of the anisotropic conductive film. The particle pitch in the arrangement axes, an axis pitch of the arrangement axes, and an inclination angle of the arrangement axes are determined according to external shapes of terminals such that 3 to 40 conductive particles are present on each of the terminals when a terminal arrangement region of an electronic component to be connected with the anisotropic conductive film is superimposed on the anisotropic conductive film such that a lengthwise direction of each of the terminals is aligned with the widthwise direction of the film.

According to another aspect of the present invention, there is provided an anisotropic conductive film including an insulating adhesive layer, and conductive particles disposed on the insulating adhesive layer. In an arbitrarily selected region having a length of 5 to 400 μm in a lengthwise direction of the film and a width equal to a film width, 3 to 3,200 conductive particles are present. In the region, arrangement axes of the conductive particles having a predetermined particle pitch obliquely intersect with a widthwise direction of the anisotropic conductive film, and the arrangement axes are arranged side by side in the lengthwise direction of the anisotropic conductive film.

Still another aspect of the present invention provides a connection structure including a first electronic component and a second electronic component connected by anisotropic conductive connection with the above-described anisotropic conductive film.

Advantageous Effects of Invention

According to the anisotropic conductive film of the present invention, when the lengthwise direction of the terminals in the electronic component to be connected with the anisotropic conductive film is aligned with the widthwise direction of the film, three or more conductive particles are present on each terminal. Thus, a sufficient level of conduction reliability can be given to the connection structure using the anisotropic conductive film. In this case, except for aligning the widthwise direction of the anisotropic conductive film with the lengthwise direction of the terminals, there is no need to perform alignment between the anisotropic conductive film and the terminals.

Moreover, since the number of the conductive particles present on each terminal is 40 or less, the conductive particles having no contribution to the connection can be prevented from excessively increasing and thus an increase in the production cost of the anisotropic conductive film due to an increase in the density of the conductive particles can be suppressed. Moreover, since the number of the conductive particles captured by the terminal can be appropriately adjusted, the introduction of new connection equipment can be omitted.

Furthermore, according to the anisotropic conductive film of the present invention, the particle pitch in the arrangement axes of the conductive particles, the axis pitch of the arrangement axes, and the inclination angle of the arrangement axes are defined according to the external shapes of the terminals of the electronic component to be connected with the anisotropic conductive film. Thus, the number of the conductive particles per terminal can be precisely controlled.

According to another aspect of the anisotropic conductive film of the present invention, 3 to 3,200 conductive particles are present in the arbitrarily selected region having a length of 5 to 400 μm in the lengthwise direction of the film and a width equal to the film width. In this region, the arrangement axes of the conductive particles having the predetermined particle pitch obliquely intersect with the widthwise direction of the anisotropic conductive film, and the arrangement axes are arranged side by side in the lengthwise direction of the anisotropic conductive film. Thus, the number of the conductive particles having no contribution to the connection can be prevented from excessively increasing and thus an increase in the production cost of the anisotropic conductive film due to an increase in the density of the conductive particles can be suppressed.

DESCRIPTION OF EMBODIMENTS

The present invention will be described below in detail with reference to the drawings. Note that the same reference signs denote the same or equivalent elements throughout the figures.

Figure 1:
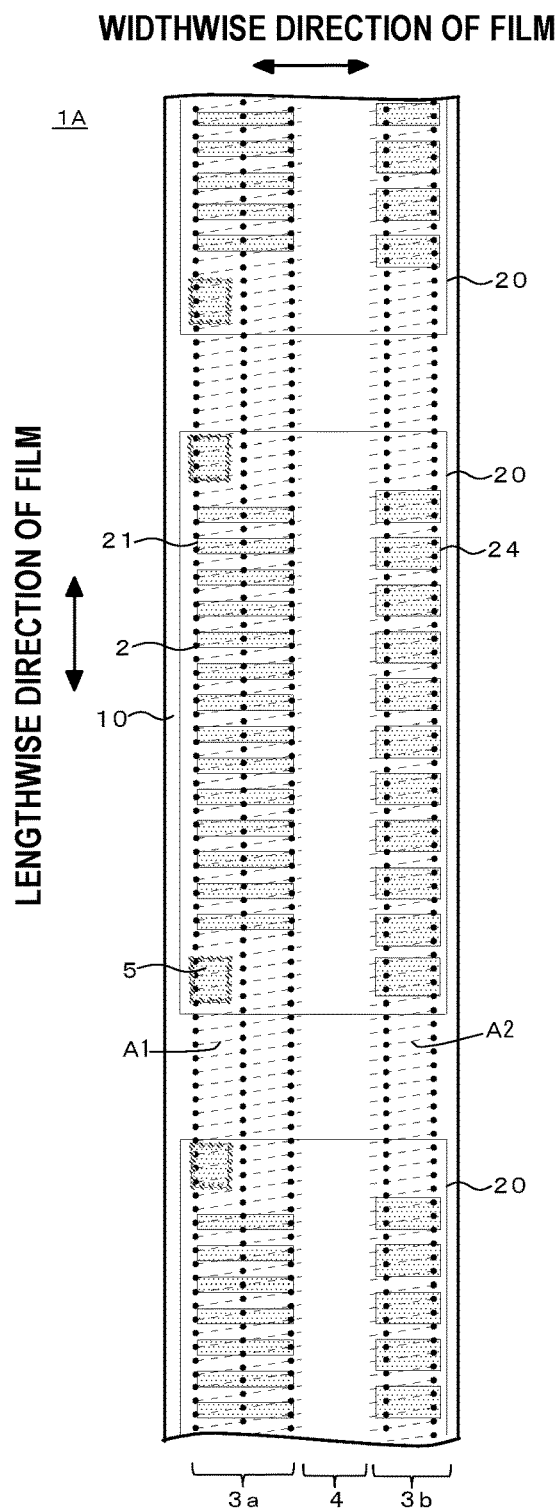
FIG. 1 is a disposition drawing of conductive particles in an anisotropic conductive film 1A.
Figure 2A:
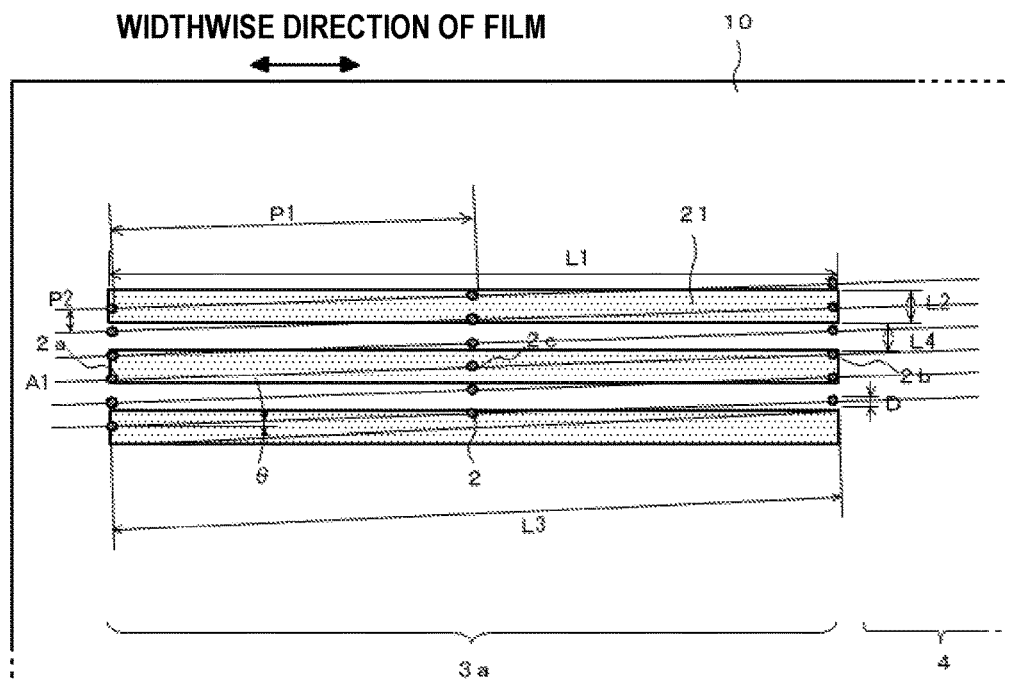
FIG. 2A is an enlarged view of the disposition of the conductive particles in FIG. 1 when an axis pitch has a minimum value.
Figure 2B:
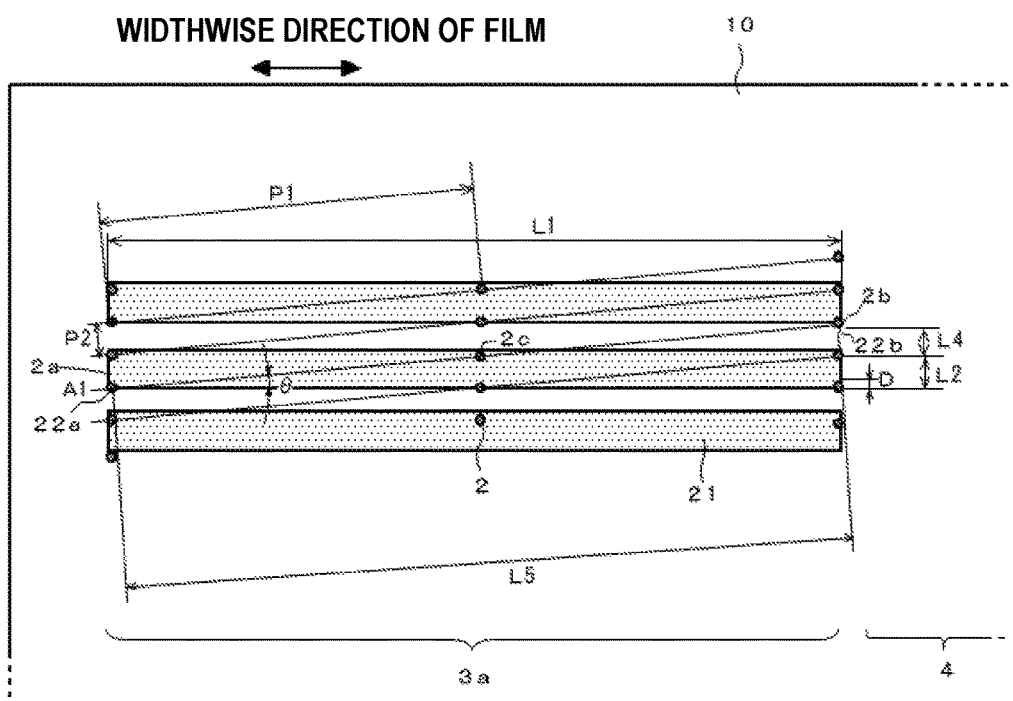
FIG. 2B is an enlarged view of the disposition of the conductive particles in FIG. 1 when the axis pitch has a maximum value.

FIG. 1 is a disposition drawing of conductive particles 2 in an anisotropic conductive film 1A according to an embodiment of the present invention. FIG. 2A is an enlarged view illustrating an arrangement region of the conductive particles corresponding to output-side terminals in the disposition drawing of FIG. 1 when an axis pitch has a minimum value, and FIG. 2B is an enlarged view similar to FIG. 2A when the axis pitch has a maximum value.

The anisotropic conductive film 1A includes an insulating adhesive layer 10, and the conductive particles 2 disposed on the insulating adhesive layer 10. The conductive particles 2 have arrangement axes A1 extending in approximately the widthwise direction of the anisotropic conductive film 1A with a predetermined particle pitch P1 but slightly inclined with respect to the widthwise direction of the film. The arrangement axes A1 are sequentially provided with a predetermined axis pitch P2 in the lengthwise direction of the anisotropic conductive film 1A.

In FIG. 1, an extra-fine rectangular outline represents a terminal face of an electronic component 20, such as an IC chip, to be connected with the anisotropic conductive film 1A. Dotted rectangular regions represent output-side terminals 21 and input-side terminals 24 in the electronic component 20. The output-side terminal 21 and the input-side terminal 24 each have a predetermined terminal width and terminal length. The output-side terminals 21 and the input-side terminals 24 are arranged with predetermined terminal pitches in the widthwise direction of the terminals. Accordingly, when the lengthwise direction of the terminals 21 and 24 in the electronic component 20 is aligned with the widthwise direction of the anisotropic conductive film 1A, the terminals 21 and 24 are arranged in the lengthwise direction of the anisotropic conductive film 1A.

In the anisotropic conductive film 1A, the particle pitch P1 of the arrangement axes A1, the axis pitch P2, and an inclination angle θ of the arrangement axes A1 are determined according to the external shapes of the terminals 21 and 24 such that the arrangement axes A1 capable of having three or more conductive particles 2 per terminal are provided and each of the terminals 21 and 24 is traversed by three or more such arrangement axes. Accordingly, 3 to 40 conductive particles 2 are present on each of the terminals 21 and 24.

More specifically, when the arrangement axis A1 of the conductive particles 2 is defined as a straight line passing through conductive particles 2a and 2b positioned at diagonal corners of the rectangular output-side terminal 21 and a conductive particle 2c at the center as shown in FIGS. 2A and 2B, the angle θ of the arrangement axes A1 relative to the widthwise direction of the anisotropic conductive film can be obtained by the following formulas wherein L1 denotes a terminal length of the terminal 21, L2 denotes a terminal width, L3 denotes a diagonal length of the terminal, L4 denotes a distance between the terminals, L5 denotes a diagonal length of a rectangle of one pitch (the terminal width L2+the distance L4 between the terminals) by the terminal length L1, and D denotes a particle diameter of the conductive particles 2.

In the case of FIG. 2A, $$\text{Tan } \theta = (L2-D)/(L1-D) \approx L2/L1 \quad \text{Formula (1)}$$

In the case of FIG. 2B, $$\text{Tan } \theta = (L2+L4-D)/(L1-D) \approx (L2+L4)/L1 \quad \text{Formula (2)}$$

Here, when the terminal length L1 and the terminal width L2 are sufficiently large relative to the particle diameter D of the conductive particles, the angle θ can be approximated by:

$$(L2/L1) \leq \text{Tan } \theta \leq (L2+L4)/L1.$$

A range of the particle pitch P1 in the arrangement axes A1 can be obtained by the following formulas wherein n denotes the maximum number of the conductive particles that can be present in the arrangement axis A1 on the terminal 21.

In the case of FIG. 2A, the particle pitch P1=(L3−D)/(n−1)≈L3/2

In the case of FIG. 2B, the particle pitch P1=(L5−D)/(n−1)≈L5/2

When n=3 and the diagonal length L3 of the terminal is sufficiently large relative to the particle diameter D of the conductive particles as shown in FIG. 2A, the particle pitch P1 can be approximated by P1≈L3/2, and can be approximated by P1≈L5/2 as shown in FIG. 2B.

A range of the axis pitch P2 of the arrangement axes A1 can be obtained by the following formulas.

In the case of FIG. 2A, the axis pitch P2=(L2−D)/2

In the case of FIG. 2B, the axis pitch P2={(L2+L4)−D}/2

Figure 3A:
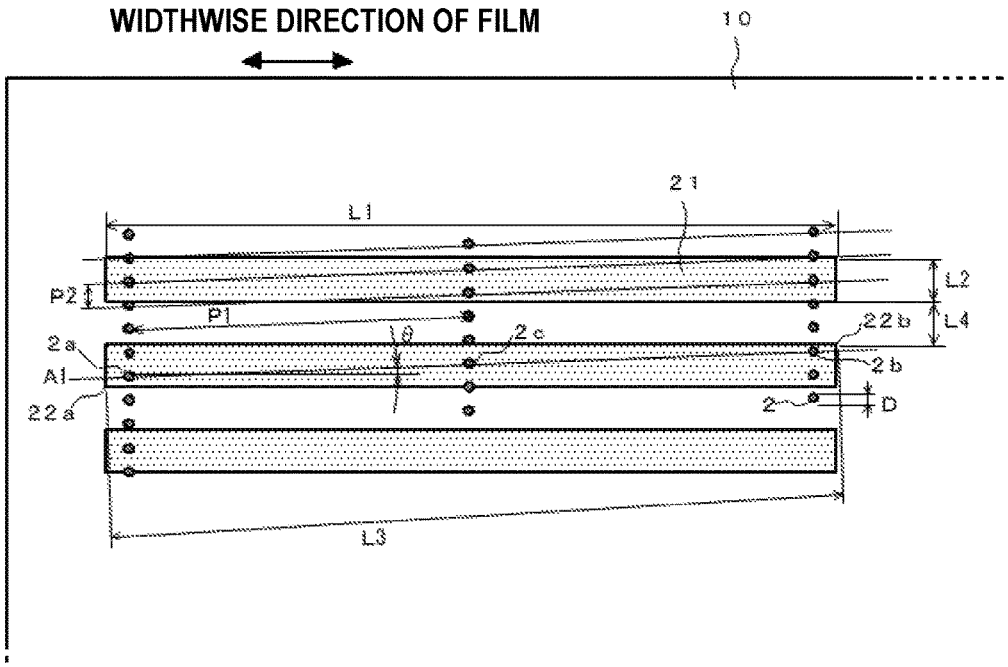
FIG. 3A is a modification of the disposition drawing of the conductive particles shown in FIG. 2A.
Figure 3B:
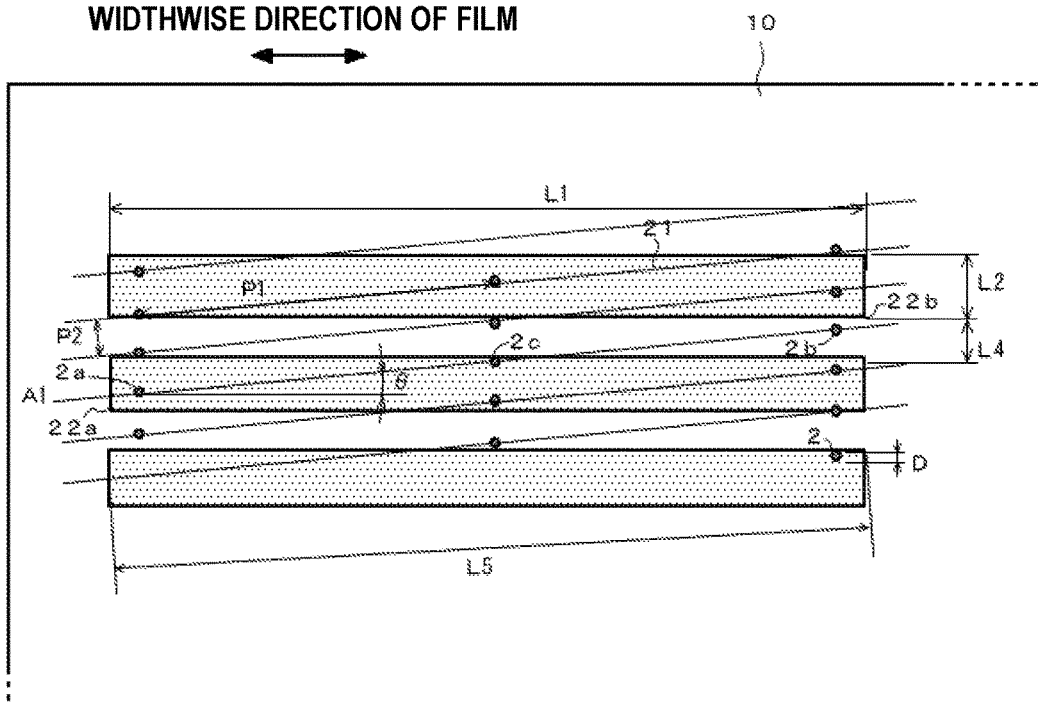
FIG. 3B is a modification of the disposition drawing of the conductive particles shown in FIG. 2B.

According to the aforementioned disposition of the particles shown in FIGS. 2A and 2B, the conductive particles 2a and 2b are present at end portions 22a and 22b of the terminal 21. In this case, if the conductive particles 2a and 2b are displaced even slightly from the end portions 22a and 22b of the terminal 21 due to resin flow during anisotropic connection, the number of captured conductive particles is decreased. In view of this, the conductive particles 2 may be disposed on the inner side of the end portions 22a and 22b of the terminal 21 to allow for a margin in design as shown in FIGS. 3A and 3B. Specifically, a unit shape (unit lattice), which is the minimum repeating unit of the arrangement of the conductive particles, may be arranged such that the conductive particles 2 are disposed on the inner side of the terminal 21 by a length corresponding to one to three times the diameter D of the conductive particles from the outer periphery of the terminal 21. By repeating the unit shape in the lengthwise direction of the film, the number of captured conductive particles can be stabilized simply by aligning the widthwise direction of the film with the shorter-side direction of the terminal.

Although not shown in FIGS. 2A to 3B, the unit shape of the arrangement can be repeated in the widthwise direction of the film to stabilize the number of captures simply by aligning the widthwise direction of the film with the lengthwise direction of the terminal. This becomes effective when the length of the terminal in the lengthwise direction is shorter than the width of the film (for example, the COG connection). When the length of the terminal in the lengthwise direction is sufficiently longer than the width of the film (for example, the FOG connection), on the other hand, there is no need for the unit shape (unit lattice) of the arrangement to be repeated in the widthwise direction of the film. In this case, all portions pressed by a tool upon the anisotropic connection contribute to the connection.

In the case of the disposition of the conductive particles 2 shown in FIGS. 3A and 3B, an angle θ of the arrangement axes A1 relative to the widthwise direction of the anisotropic conductive film, the particle pitch P1, and the axis pitch P2 can be obtained by approximation formulas that subtract (0.5×D) to (3×D) from L1, L2, L3, or L5 in the aforementioned calculation formulas of the angle θ, the particle pitch P1, and the axis pitch P2 in the disposition of the particles shown in FIGS. 2A and 2B.

In the present invention, the number n of the conductive particles captured in each terminal is set to three or more in consideration of conduction reliability. To further stabilize the conduction reliability, the number n of the conductive particles is set preferably to 5 or more, more preferably to 6 or more, and further more preferably to 10 or more. In consideration of not excessively increasing the number density of the conductive particles, n is set to 40 or less. For the same reason, 35 or less is preferred, 30 or less is more preferred, and 20 or less is further more preferred. Accordingly, the upper limit of the number of particles present within one pitch (L2+L4) (in other words, particles present within a region of L1×(L2+L4)) is determined by a ratio between L2 and L4 (what is called a line and space (L/S)) and equal to or less than 40×{(L2+L4)/L2}. The upper limit of the number density can therefore be obtained from a value obtained by dividing 40×{(L2+L4)/L2} by an area of L1×(L2+L4).

Generally in the COG connection, the area of the terminal may be reduced or the L/S may be reduced even when the outer dimensions of the IC chip to be connected are unchanged. Also in such a case, according to the present invention, the inclination angle θ of the arrangement axes A1, the particle pitch P1, and the axis pitch P2 are determined according to the external shape of the output-side terminal 21 such that the arrangement axes A1 are sequentially provided in the lengthwise direction of the film and 3 to 40, preferably 5 to 35, and more preferably 10 to 30 conductive particles are disposed per any single output-side terminal 21. Consequently, when such an anisotropic conductive film 1A is used for the anisotropic conductive connection, the terminals can reliably capture the conductive particles 2 and a good conduction property can be therefore obtained. Moreover, the number density of the conductive particles can be prevented from excessively increasing, and an increase in the production cost of the anisotropic conductive film due to the increase in the number density of the conductive particles can be therefore suppressed. At the same time, the pressing force can be suppressed to an appropriate range.

Note that the inclination angle θ of the arrangement axes A1, the particle pitch P1, and the axis pitch P2 to dispose 3 to 40 conductive particles per output-side terminal are not limited to those in the dispositions of the conductive particles 2 shown in FIGS. 2A, 2B, 3A, and 3B. The inclination angle θ of the arrangement axes A1 may be determined so as to satisfy $0 \leq \tan \theta \leq \{(L2+L4)/L1\}$, for example. Note however that the angle θ is preferably larger than 0° in terms of reducing variations in the number of the conductive particles captured by the terminal after the anisotropic conductive connection.

When the terminal width of the input-side terminal 24 is large relative to the output-side terminal 21 in the electronic component 20, an angle of arrangement axes A2 of the conductive particles 2 used for connecting the input-side terminals 24 relative to the widthwise direction of the film, a particle pitch, and an axis pitch can be set as with the arrangement axes A1 of the conductive particles 2 used for connecting the output-side terminals 21. In other words, when an electronic component to be connected with the anisotropic conductive film has a plurality of terminal arrangement regions having different terminal sizes or L/S values, the anisotropic conductive film in the present invention is configured such that 3 to 40, preferably 5 to 35, and more preferably 10 to 30 conductive particles 2 are captured by each terminal in an arrangement of terminals having the minimum terminal width or terminal area. Even when an electronic component has arrangements of terminals with difference sizes, the conductive particles are disposed all over the surface according to the terminal with the smallest size. This can reduce types of anisotropic conductive film made for the electronic component. The production cost of the anisotropic conductive film can therefore be reduced.

In the present invention, the density of the conductive particles 2 in arrangement regions 3a and 3b of the conductive particles is preferably 7.5 to 80,000 particles/mm$^2$, more preferably 25 to 70,000 particles/mm$^2$, and further more preferably 100 to 60,000 particles/mm$^2$ in order to ensure conduction reliability and to suppress an increase in the load of the pressing force required in a connection device. This particle density is appropriately adjusted according to the particle diameter of the conductive particles 2, the terminal widths, the terminal lengths, and the arrangement configurations.

Moreover, positions at which the conductive particles are present can be appropriately set in the present invention. In the case of the COG connection, for example, opposite end portions in the widthwise direction of the film are regions to be used for the connection. Thus, the arrangement regions 3a and 3b of the conductive particles can be set so as to sufficiently cover such portions. More specifically, in the anisotropic conductive film 1A shown in FIG. 1, the arrangement region 3a of the conductive particles corresponding to the output-side terminals 21 and the arrangement region 3b of the conductive particles corresponding to the input-side terminals 24 in the electronic component 20 assumed to be a general IC chip used in the COG, having rows of the terminals positioned in the vicinity of the longer-side ends of the rectangular shape, are continuously formed in the lengthwise direction of the anisotropic conductive film 1A with a buffer region 4, in which no conductive particles are disposed, interposed between the arrangement regions 3a and 3b. Also by providing the arrangement regions of the conductive particles in a plurality of rows according to the terminal arrangements of the electronic component as described above, the number of the conductive particles having no contribution to the connection can be decreased. Thus, the production cost of the anisotropic conductive film can be reduced. Note that the buffer region 4 may include not only a region where no conductive particles are present but also a region where the conductive particles are not disposed in a predetermined regular arrangement within a range not to interfere with the anisotropic connection. By allowing for the existence of such a region, an anisotropic conductive film including slightly defective disposition of the conductive particles can be provided as an anisotropic conductive film product. Accordingly, the product yield can be improved, and the cost can be reduced.

In the anisotropic conductive film of the present invention, the arrangement axes A1 may be inclined with respect to, or may be parallel to, the widthwise direction of the film. The inclined arrangement axes A1 are more preferred in terms of improving the performance of capturing the conductive particles in each terminal. Alternatively, in order to adapt to terminals having different external shapes, there may be a plurality of types of arrangement axes A1 and A2 having different inclination angles according to the external shapes of the terminals.

In such an anisotropic conductive film 1A, on the other hand, conductive particle arrangement regions 5, each corresponding to the external shape of an alignment mark of the electronic component 20, are formed periodically in the lengthwise direction of the anisotropic conductive film 1A.

In general, alignment marks are formed in electronic components for the alignment of terminals of the electronic components to be joined. When conductive particles are disposed evenly over an anisotropic conductive film, on the other hand, there is no need to align a terminal of an electronic component with a region where the conductive particles are formed in the anisotropic conductive film. Thus, no alignment marks are provided in the anisotropic conductive film.

In the anisotropic conductive film 1A, on the other hand, the arrangement region 3a of the conductive particles corresponding to the arrangement of the output-side terminals 21 and the arrangement region 3b of the conductive particles corresponding to the arrangement of the input-side terminals 24 are separately formed. Thus, the conductive particle arrangement regions 5, corresponding to the alignment marks provided on the electronic component to which the anisotropic conductive film 1A is bonded, are preferably provided in the anisotropic conductive film 1A. Aligning the conductive particle arrangement regions 5 with the alignment marks in the electronic component facilitates an operation of aligning the arrangement region 3a of the conductive particles in the anisotropic conductive film 1A with the arrangement region of the output-side terminals 21 in the electronic component 20 and aligning the arrangement region 3b of the conductive particles in the anisotropic conductive film 1A with the arrangement region of the input-side terminals 24 in the electronic component.

While disposing a marking member, corresponding to the alignment mark in the electronic component, on the insulating adhesive layer 10 of the anisotropic conductive film 1A may be conceivable, such implementation is difficult due to limitations in the production process of the anisotropic conductive film. Also, while marking such as directly stamping on, or making an incision in, the insulating adhesive layer 10 may be conceivable, it is difficult to perform such a marking operation in reality due to too small alignment marks.

When an arrangement of the conductive particles is used as an alignment mark as in the aforementioned conductive particle arrangement region 5, on the other hand, there is no need to add a new step to the production process of the anisotropic conductive film. Moreover, without having any particular limitation when the anisotropic conductive film is used for the anisotropic conductive connection, the arrangement regions 3a, 3b of the conductive particles can be aligned with the arrangement of the output-side terminals 21 and the arrangement of the input-side terminals 24 in the electronic component.

Moreover, in this anisotropic conductive film 1A, since the number of the conductive particles 2 captured by the terminals 21 and 24 is decreased as much as possible while ensuring the connection and the conductive particles 2 are arranged, the anisotropic conductive film 1A has high transparency. Therefore, an alignment operation can be performed without any difficulty by through-view from a transparent substrate side. Thus, the degree of design freedom of the alignment mark on the IC chip side can be increased. Accordingly, the alignment marks on the IC chip side can be provided in the vicinity of the region where the terminals are formed, thus enabling improvement in alignment accuracy. Alternatively, an arrangement of the conductive particles, an electrode of the transparent substrate, and a terminal of the IC chip can be directly aligned with one another with the use of a high-accuracy CCD, for example.

When the alignment mark on the IC chip side has a rectangular shape and thus has a similarity to the terminal, or when the conductive particle arrangement region corresponding to the alignment mark is provided, it is expected that approximate conformity between the arrangement of the conductive particles and the alignment mark on the IC chip side enables the alignment of the IC chip with higher accuracy. For example, by focusing the arrangement of the conductive particles (i.e., the inside of the anisotropic conductive film 1A) when a CCD or a laser is used for alignment from the transparent substrate side, a benchmark is provided between the alignment mark on the IC chip side and the transparent substrate. It can be expected that the use of this benchmark enables the detection of the alignment mark on the IC chip side with higher accuracy.

Figure 4:
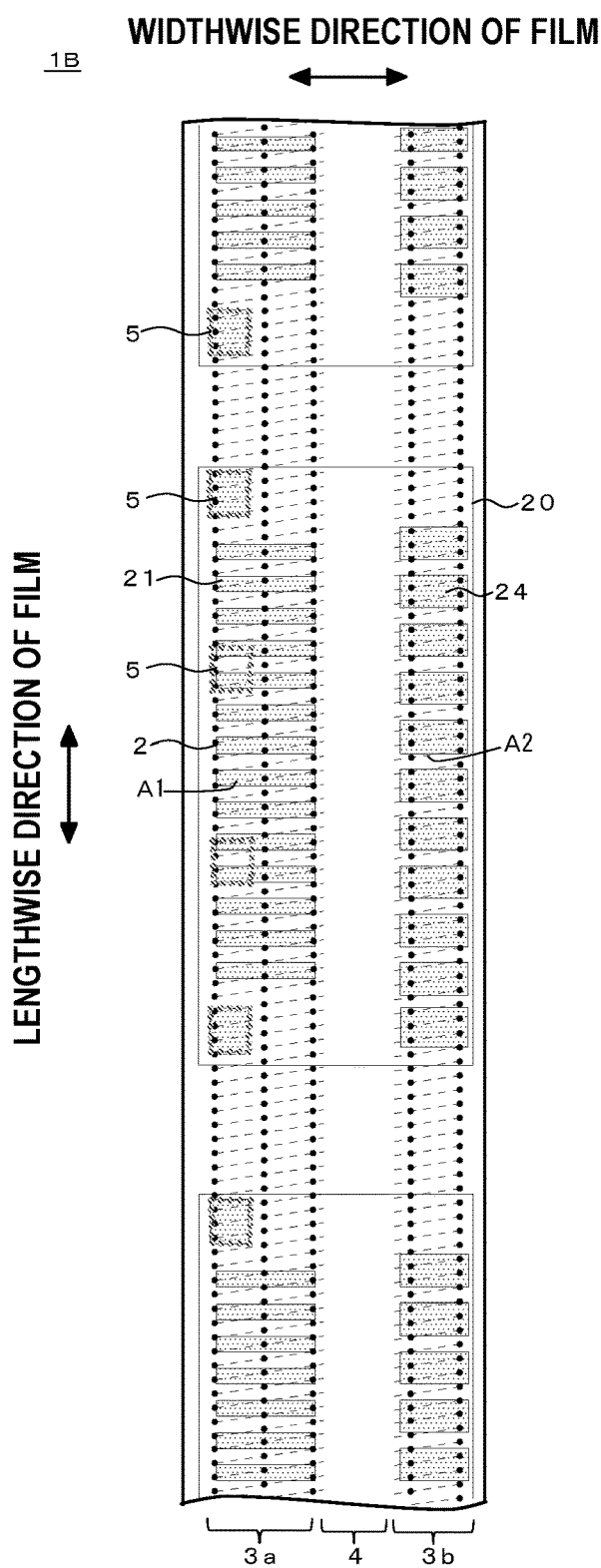
FIG. 4 is a disposition drawing of conductive particles in an anisotropic conductive film 1B.

The anisotropic conductive film of the present invention can take various forms. For example, an anisotropic conductive film 1B shown in FIG. 4 is configured such that the conductive particle arrangement regions 5, corresponding to the alignment marks of the electronic component, in the anisotropic conductive film 1A shown in FIG. 1 are formed periodically in the lengthwise direction of the anisotropic conductive film 1A.

Accordingly, a distance by which the anisotropic conductive film is displaced in the lengthwise direction of the film for the alignment between the alignment mark in the electronic component and the conductive particle arrangement region 5 can be reduced.

Figure 5:
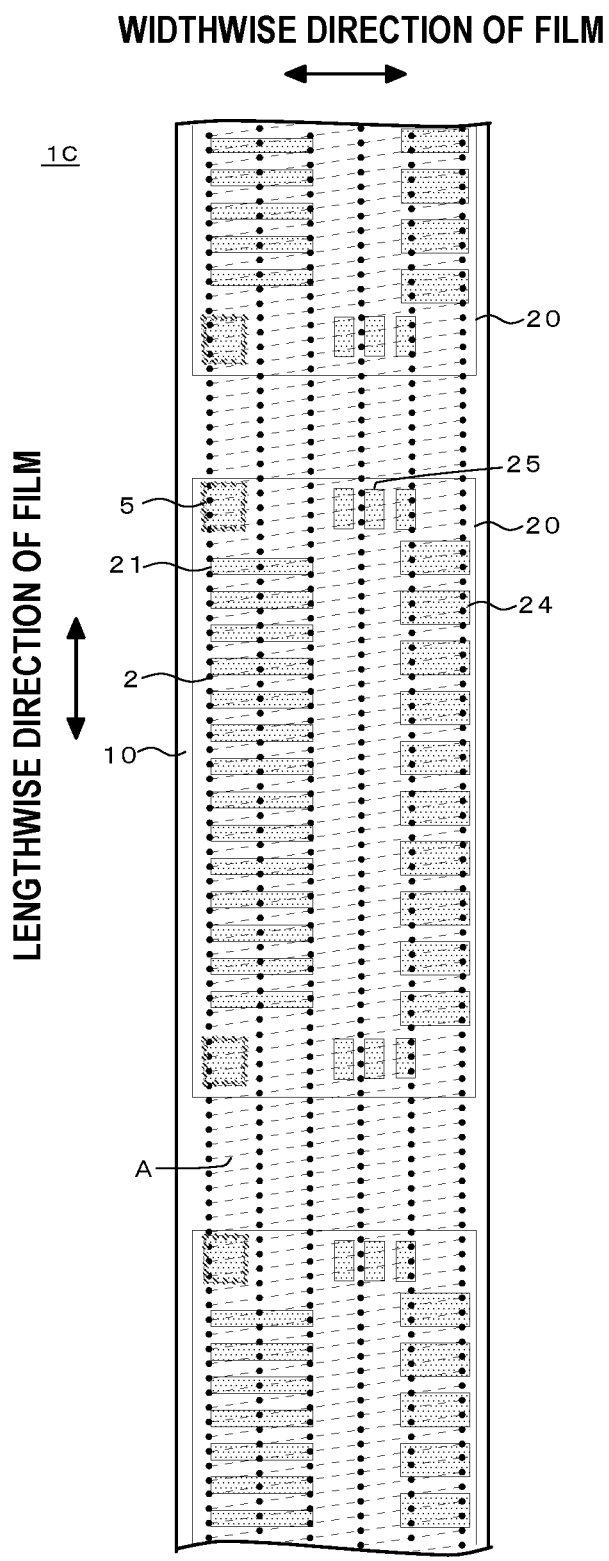
FIG. 5 is a disposition drawing of conductive particles in an anisotropic conductive film 1C.

An anisotropic conductive film 1C shown in FIG. 5 is configured such that the buffer region 4 is eliminated from the anisotropic conductive film 1A shown in FIG. 1 to continue the arrangement region of the conductive particles corresponding to the output-side terminals 21 in the electronic component with the arrangement region of the conductive particles corresponding to the input-side terminals 24 in the electronic component. Accordingly, an electronic component having side terminals 25, in addition to the output-side terminals 21 and the input-side terminals 24, can also be connected thereto. Such an anisotropic conductive film can be used also for connection when a plurality of terminals (rows) are provided over the entire surface of an electronic component as in the FOG connection.

When the conductive particles are present all over the film as shown in FIG. 5, the disposition of the conductive particles is preferably designed in conformity with the terminal in the arrangement of the terminals having the minimum terminal width or terminal area as mentioned above.

In contrast to this, the dispositions of the conductive particles may differ among regions corresponding to terminal arrangements having different layouts. In consideration of the number of steps for designing the arrangements of the conductive particles and cost benefit obtained by a reduced number of the conductive particles, however, designing an arrangement for each terminal layout of an electronic component is inadvisable. Using a single anisotropic conductive film for a electric component having different terminal layouts can reduce the number of types of anisotropic conductive film, thus obtaining cost benefit. Such an economical effect can be expected also when a margin corresponding to a length one to three times the conductive particle diameter D is set in the design of the terminal disposition as mentioned above.

In the anisotropic conductive films shown in FIGS. 1, 4, and 5, the arrangement axes A1 of the conductive particles are sequentially formed with a predetermined pitch in the lengthwise direction of the anisotropic conductive film. Accordingly, the arrangement of the conductive particles in such an anisotropic conductive film has a lattice axis in the lengthwise direction of the anisotropic conductive film. In the anisotropic conductive film of the present invention, however, the arrangement of the conductive particles is not limited thereto. For example, the arrangement axes A1 may be provided sequentially with a predetermined inclination angle $\phi$ and with a predetermined pitch in the lengthwise direction of an anisotropic conductive film as in an anisotropic conductive film 1D shown in FIG. 6. In the thus formed lattice-shaped arrangement of the conductive particles, the lattice axes in three directions obliquely intersect with the lengthwise direction and widthwise direction of the anisotropic conductive film. This can eliminate a problem such that a row of the conductive particles, interposed between edge portions of terminals opposed to each other upon the anisotropic connection, is deviated from the terminals all together and unstable conduction is thus created.

Figure 6:
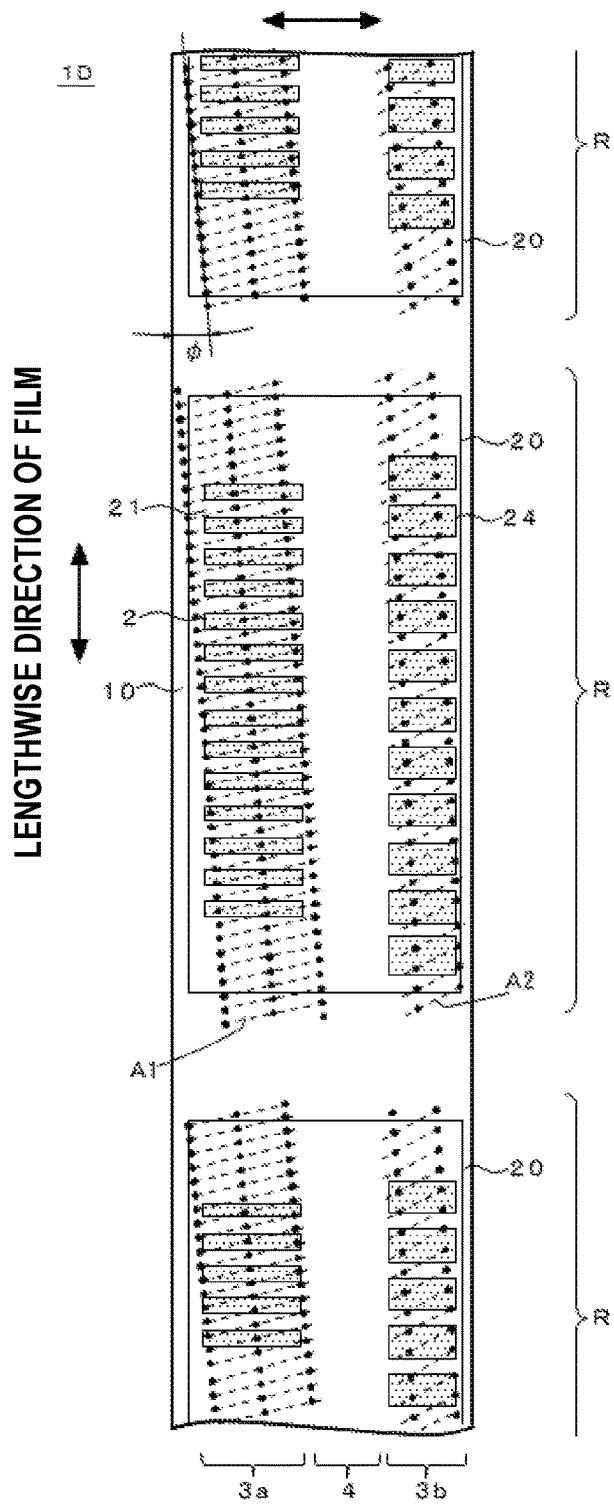
FIG. 6 is a disposition drawing of conductive particles in an anisotropic conductive film 1D.

When electronic components are sequentially connected as shown in FIG. 6, no particles may be disposed at cutting positions, at which the film is cut to have a predetermined length, in the lengthwise direction of the film. A length of the region in which no particles are disposed in the lengthwise direction of the film is 0.2 to 6 mm, for example. Such a region may be utilized as a mark for cutting when the connection is sequentially performed.

In the present invention, the arrangement of the conductive particles may be formed by a plurality of types of arrangement axes of the conductive particles. The particle pitch of the conductive particles in one arrangement axis may not be fixed. For example, a wide pitch and a narrow pitch may be provided repeatedly. With regard to the axis pitch, a wide pitch and a narrow pitch may also be provided repeatedly.

According to another aspect of the present invention, three or more arrangement axes of the conductive particles can be present so as to obliquely intersect with the lengthwise direction of the terminal. Regarding a width of a terminal to be connected with the anisotropic conductive film of the present invention or a distance of the sum (terminal pitch) of the terminal width and a space between the terminals, the minimum is a terminal width of 5 µm and the maximum is a terminal pitch of 400 µm, for example. The direction of the terminal width or the terminal pitch coincides with the lengthwise direction of the film in a general anisotropic conductive film. Accordingly, in an arbitrarily selected region R having a length of 5 to 400 µm in the lengthwise direction of the film and a width equal to a film width, 3 or more arrangement axes of the conductive particles obliquely intersect with the region R. The number of particles in this case is, at the maximum, 3,200 ((400 µm/5 µm)×40=3,200) in the region having 5 µm in the lengthwise direction of the film and, at the minimum, 3 (preferably 6) in the region having 400 µm in the lengthwise direction of the film. Accordingly, this is an anisotropic conductive film in which 3 to 3,200 (preferably 6 to 3,200) conductive particles are arranged side by side as the arrangement axes obliquely intersecting with the lengthwise direction of the film in an area obtained by multiplying 5 to 400 µm in the lengthwise direction of the film by the width of the film. The region R can be selected as desired in the lengthwise direction of the film.

In order to perform the anisotropic connection in a stable manner, it is practically preferable that the above-described region with 5 to 400 µm in the lengthwise direction of the film be sequentially provided over a length corresponding to 500 sets, i.e., the region with 5 µm, at the minimum, be repeatedly provided over a length used for the anisotropic connection of 2,500 µm. In order to perform the anisotropic connection more economically, it is more preferable that a length corresponding to 5,000 sets continue, and it is further preferable that a length corresponding to 10,000 sets continue. That is, based on the conversion of one set into the maximum value of 400 µm containing the minimum value of 5 µm, the regions are sequentially provided preferably over 20 cm or more, more preferably over 2 m or more, and further more preferably over 4 m or more in order to perform the anisotropic connection more economically.

In the present invention, a composition of the conductive particle 2 itself, a layer configuration of the insulating adhesive layer 10, or a constituent resin can take various forms.

More specifically, the conductive particles 2 can be appropriately selected and used from among those used in the known anisotropic conductive films. Examples of the conductive particles 2 may include metal particles such as nickel, cobalt, silver, copper, gold, palladium, and solder, and metal coated resin particles. Two or more materials may be used in combination. While an average particle diameter of the conductive particles is not limited to any particular value, 1 to 100 µm is preferable. Moreover, the diameter of the conductive particles is preferably 50% or less, more preferably 30% or less, of the terminal width. With regard to variations in the diameter of the conductive particles, a CV value of 25% or less is preferable.

An insulating resin layer used in a known anisotropic conductive film can be appropriately employed as the insulating adhesive layer 10. For example, a photo-radical polymerization resin layer including an acrylate compound and a photo-radical polymerization initiator, a thermal radical polymerization resin layer including an acrylate compound and a thermal radical polymerization initiator, a thermal cation polymerization resin layer including an epoxy compound and a thermal cation polymerization initiator, a thermal anion polymerization resin layer including an epoxy compound and a thermal anion polymerization initiator, or the like may be used. These resin layers may be polymerized as needed. Alternatively, the insulating adhesive layer 10 may be formed from a plurality of resin layers.

Insulating fillers such as silica microparticles, alumina, or aluminum hydroxide may be added to the insulating adhesive layer 10 as needed. The size of the insulating fillers is preferably 10 to 2,000 nm. The blending amount of the insulating fillers is preferably 1 to 60 parts by mass relative to 100 parts by mass of the resin for forming the insulating adhesive layer. This can prevent, even when the insulating adhesive layer 10 is melted upon the anisotropic conductive connection, unwanted movement of the conductive particles 2 by the melted resin.

Regardless of a single layer or a multi-layer, the minimum melt viscosity of the insulating adhesive layer 10 is preferably 10 to 10,000 Pa·s in the overall minimum melt viscosity. As long as the minimum melt viscosity falls within this range, the conductive particles can be fixed precisely at desired positions and no interference with the anisotropic connection is caused. Such a range can also adapt to diversification in connection methods and electronic components to be connected. The minimum melt viscosity can be obtained, for example, with a rotational rheometer (manufactured by TA Instruments) having a temperature increase rate of 10° C./minute, kept constant at a measurement pressure of 5 g, and using a measurement plate with a diameter of 8 mm.

Practically, a film length of the anisotropic conductive film is preferably 5 m or more, more preferably 10 m or more, and further more preferably 30 m or more. While no particular upper limit is set, the cost of the anisotropic connection can be kept low when no excessive alternation is made on the conventional connection device. Accordingly, the film length is preferably 5,000 m or less, more preferably 1,000 m or less, and further more preferably 500 m or less. While the film width is not limited to any particular value, a width of 0.3 mm or more is preferred in order to adapt to not only a terminal row region in a general electronic component but also a slim border terminal row region, a width of 0.5 mm or more is practically more preferred, and a width of 0.6 mm or more is further more preferred from the viewpoint of stability in production. While no particular upper limit is set, the film width is generally 5 mm or less. Since the film width may need to be wider than a wafer in applications such as stacking ICs, the film width may be about 30 cm.

To form a long anisotropic conductive film as described above, the anisotropic conductive films may be connected together with connection tape. Alternatively, the anisotropic conductive film may be a roll wound around a winding core.

A method of fixing the conductive particles 2 in the above-described disposition on the insulating adhesive layer 10 may include: making a mold having recesses corresponding to the disposition of the conductive particles 2 by a known method such as machining, laser machining, or photolithography; placing the conductive particles in the mold; filling the mold with a composition for forming the insulating adhesive layer over the conductive particles and curing the composition; and removing the cured product from the mold. From such a mold, another mold may be made with a material having lower rigidity.

As another method, in order to place the conductive particles 2 in the above-described disposition on the insulating adhesive layer 10, a member having through holes in the predetermined disposition may be provided on a composition layer for forming an insulating adhesive layer, and the conductive particles 2 may be supplied from thereabove so that conductive particles 2 pass through the through holes.

Alternatively, a sheet body having arrangemented protrusions, each having approximately the same size as the conductive particle, may be produced. Slightly adhesive layers may be then formed on top surfaces of the protrusions. The conductive particles may be attached to the slightly adhesive layers and then transferred onto the insulating adhesive layer. As just described, a method of producing the anisotropic conductive film of the present invention is not limited to any particular method.

When the anisotropic conductive connection between a terminal of a first electronic component including a flexible substrate, a transparent substrate such as a glass substrate, a rigid substrate, or a non-transparent substrate such as a ceramic substrate and a terminal of a second electronic component such as an FPC, an IC chip, or an IC module is performed with the anisotropic conductive film of the present invention, the lengthwise direction of the anisotropic conductive film 1A is aligned with the shorter-side direction of the terminal of the first electronic component or the second electronic component, the alignment marks of the first and second electronic components are further aligned with each other, and heat and pressure are applied thereto, for example. The present invention further encompasses an embodiment in which IC chips or IC modules are stacked and only such second electronic components are anisotropically, conductively connected to each other. Note that electronic components to be connected with the anisotropic conductive film of the present invention are not limited thereto.

The present invention also encompasses a connection structure produced by the anisotropic conductive connection between the first electronic component and the second electronic component as described above.

EXAMPLES

The present invention will be specifically described below with reference to Examples.

Examples 1 to 11 and Comparative Examples 1 and 2

(1) Production of Anisotropic Conductive Film for COG Connection

With regard to Examples 1 to 11 and Comparative Examples 1 and 2, each of resin compositions having chemical compositions shown in Table 1 was prepared, applied onto a PET film having a film thickness of 50 μm, and dried for 5 minutes in an oven at 80° C. so as to have a thickness shown below on the PET film.

TABLE 1

| | (parts by mass) |
|---|---|
| First Insulating Resin (Film Thickness of 15 μm) | |
| Phenoxy Resin (Nippon Steel & Sumitomo Metal Corporation, YP-50 (Thermoplastic Resin)) | 30 |
| Epoxy Resin (Mitsubishi Chemical Corporation, jER828 (Thermosetting Resin)) | 40 |
| Cationic Curing Agent (Sanshin Chemical Industry Co., Ltd., SI-60L (Latent Curing Agent)) | 2 |
| Second Insulating Resin (Film Thickness of 5 μm) | |
| Phenoxy Resin (Nippon Steel & Sumitomo Metal Corporation, YP-50 (Thermoplastic Resin)) | 30 |
| Epoxy Resin (Mitsubishi Chemical Corporation, jER828 (Thermosetting Resin)) | 40 |
| Cationic Curing Agent (Sanshin Chemical Industry Co., Ltd., SI-60L (Latent Curing Agent)) | 2 |
| Filler (Nippon Aerosil Co., Ltd., AEROSIL RX300) | 30 |

In accordance with the disposition of electrode terminals in a substrate to be subjected to the COG connection, on the other hand, a mold in which convex portions periodically have an arrangement pattern in a predetermined disposition density (Examples 1 to 11), a mold in which convex portions have a random dispostion in a predetermined disposition density (Comparative Example 1), or a mold in which an arrangement pattern of conductive particles is provided only at positions within the electrode terminals (Comparative Example 2, the density of the conductive particles in a region for forming bumps is 1,800 particles/mm$^2$ (5 conductive particles per bump, 2,800 μm$^2$ is obtained by multiplying 28 μm, which is the sum of a bump width of 15 μm and a distance between bumps of 13 μm, by a bump length of 100 μm. An area obtained by multiplying 2,800 μm$^2$ by 1,300, which is the number of the bumps, corresponds to the region for forming bumps. (Five conductive particles/bump×the number of the bumps: 1,300)/(2,800 μm$^2$× 1,300)=1,800 particles/mm$^2$)) was produced. Pellets of a known transparent resin in a melted state were poured into the mold and cooled to cure. In this manner, a resin mold having lattice-patterned recess portions was formed. The recess portions of this resin mold were filled with the conductive particles (SEKISUI CHEMICAL CO., LTD., AUL704, a particle diameter of 4 μm), and the above-described second insulating resin layer was placed thereon. A pressure of 0.5 MPa was applied thereto at 60° C. so that the conductive particles stick to the second insulating resin layer. Thereafter, the insulating resin was peeled off from the mold. The first insulating resin layer was layered at 0.5 MPa and 60° C. on an interface of the second insulating resin layer at which the conductive particles were present. In this manner, the anisotropic conductive films of Examples and Comparative Examples, which are shown in Tables 2 to 4, were produced.

Note that an IC chip and a glass substrate to be subjected to the COG connection had terminal patterns corresponding to each other. In any of Examples and Comparative Examples, a conductive particle arrangement region was formed all over the film surface. Detailed sizes of chips to be subjected to the COG connection in Examples 1 and 2 and Comparative Examples 1 and 2 are as shown below. In chips to be subjected to the COG connection in the other examples, bump sizes were changed as shown in Tables 3 and 4. Along with changes in the bump width and the space between bumps, the number of bumps was appropriately adjusted. In FIGS. 7 to 11 showing these examples, the conductive particle was disposed at a corner of the bump in the upper left of the figure to facilitate understanding of the effects of the anisotropic connection in the present invention. Thus, it took some time and effort to perform an operation of temporarily bonding the film to the glass substrate and an operation of mounting the IC.

In the IC chips, bump rows are formed in regions opposed to each other along opposed longer sides of the IC chip. A distance between the bump rows is 1.5 mm for a bump length of 100 μm and 1.6 mm for a bump length of 50 μm.

IC chip
External shape: 1.8×20 mm, thickness: 0.5 mm
Thickness: 0.2 mm
Bump specifications: gold plating, height: 12 μm, size: 15×100 μm, distance between bumps: 13 μm, the number of bumps: 1,300 (650 bumps are arranged for each of the longer sides of the external shape)
Alignment mark: 100 μm×100 μm
Glass substrate
Glass material: manufactured by Corning Incorporated
External shape: 30×50 mm
Thickness: 0.5 mm
Electrode: ITO line (2) Evaluations The anisotropic conductive film in each of Examples and Comparative Examples was interposed between the IC chip with the bump size shown in Tables 2 to 4 and the glass substrate corresponding to that IC chip, and heat and pressure (180° C., 80 MPa, 5 seconds) were applied thereto to obtain a connected structure for evaluation. The connected structure for evaluation was subjected to the following tests.

In this case, with regard to the anisotropic conductive film including a conductive particle formed region (100 μm×100 μm) corresponding to an alignment mark (in a quantity within a range not to affect the number density of the conductive particles per unit area), the alignment between the glass substrate and the anisotropic conductive film was performed first by manually performing the alignment between the glass substrate and the anisotropic conductive film while checking the conductive particle formed regions with a stereomicroscope and then temporarily bonding the anisotropic conductive film to the glass substrate. Thereafter, temporary pressure bonding was performed at 60° C. and 2 MPa for 1 second. The anisotropic conductive film temporarily pressure-bonded to the glass substrate was then aligned with the IC chip, and heat and pressure were applied thereto to connect the IC chip. In this manner, the connected structure for evaluation was obtained. Here, Flip Chip Bonder FC1000 (Toray Engineering Co., Ltd.) was used to connect the IC chip.

When the IC chip and the glass substrate are connected together with the anisotropic conductive film including no conductive particle formed region corresponding to the alignment mark, on the other hand, a connected structure for evaluation, made by the glass substrate and the IC chip, was obtained in the same manner as the anisotropic conductive film including the conductive particle formed region corresponding to the alignment mark except that alignment with the anisotropic conductive film was performed such that the conductive particles were disposed as in the figures described in the tables at positions corresponding to the terminals of the glass substrate. According to this method, an amount of time required for temporarily bonding the film to the glass substrate was slightly prolonged.

In the bonding of the anisotropic conductive film to the glass substrate, film alignment approximately coinciding with that shown in the figures was defined as film misalignment of 0%, and film alignment intentionally displaced by 50% of the terminal width of the IC to be connected in the lengthwise direction of the film (widthwise direction of the terminal) was defined as 50%.

In each of such film alignments, (a) the number of particles on the terminal before the connection, (b) the initial conduction property, (c) the conduction reliability, and (d) the occurrence rate of a short circuit were evaluated as shown below.

(a) The Number of Particles on Terminal Before Connection

Two hundred terminals before connection for evaluation were observed from the glass surface side to find out the number of capturable conductive particles on a single terminal. An evaluation was made according to the following criteria.

A: 10 or more particles
B: 5 or more and less than 10 particles
C: 3 or more and less than 5 particles
D: less than 3 particles (b) Initial Conduction Property The conduction resistance of the connected structure for evaluation was measured to make an evaluation according to the following criteria.

OK: less than 2 Ω
NG: 2Ω or more (c) Conduction Reliability

The connected structure for evaluation was placed in a thermostatic bath at a temperature of 85° C. and a humidity of 85% RH for 500 hours and the conduction resistance of the structure was measured. An evaluation was made according to the following criteria.

OK: less than 8 Ω
NG: 8Ω or more (d) Occurrence Rate of Short Circuit

The following IC (a comb-shaped test element group (TEG) with a space of 7.5 μm) was prepared as an IC for evaluating the occurrence rate of a short circuit.

Outer shape: 1.5×13 mm
Thickness: 0.5 mm
Bump specifications: gold plating, height: 15 μm, size: 25×140 μm, distance between bumps: 7.5 μm The anisotropic conductive film in each of Examples and Comparative Examples was interposed between the IC for evaluating the occurrence rate of a short circuit and the glass substrate with a pattern corresponding to that evaluation IC, and heat and pressure were applied thereto under the same connection conditions as the production of the connected structure for evaluation. The occurrence rate of a short circuit in the connected structure was then obtained. The occurrence rate of a short circuit is calculated by "the number of occurrences of a short circuit/the total number of spaces of 7.5 μm."

The occurrence rate of a short circuit at 200 ppm or more is undesirable in terms of the production of practically-used connection structures. In view of this, the calculated occurrence rate of a short circuit was evaluated according to the following criteria.

OK: less than 200 ppm
NG: 200 ppm or more

TABLE 2

Figure 7:
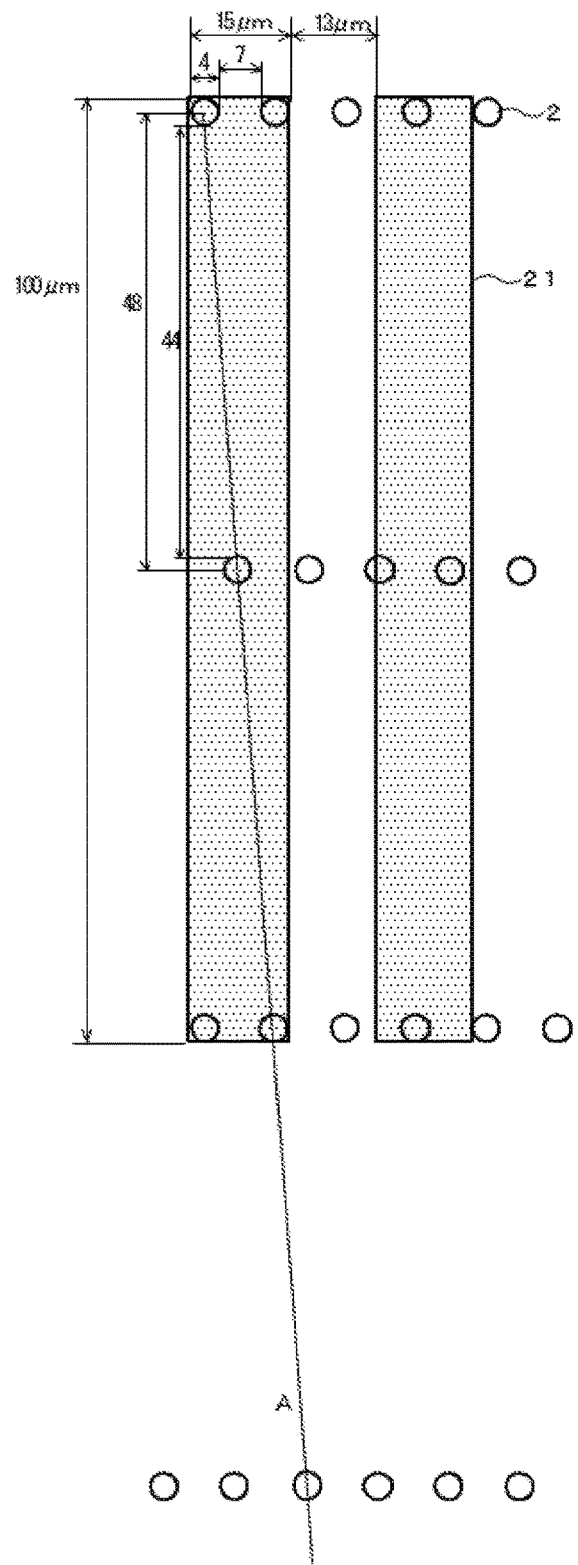
FIG. 7 is a disposition drawing of conductive particles in anisotropic conductive films of Examples 1 and 2.
Figure 12:
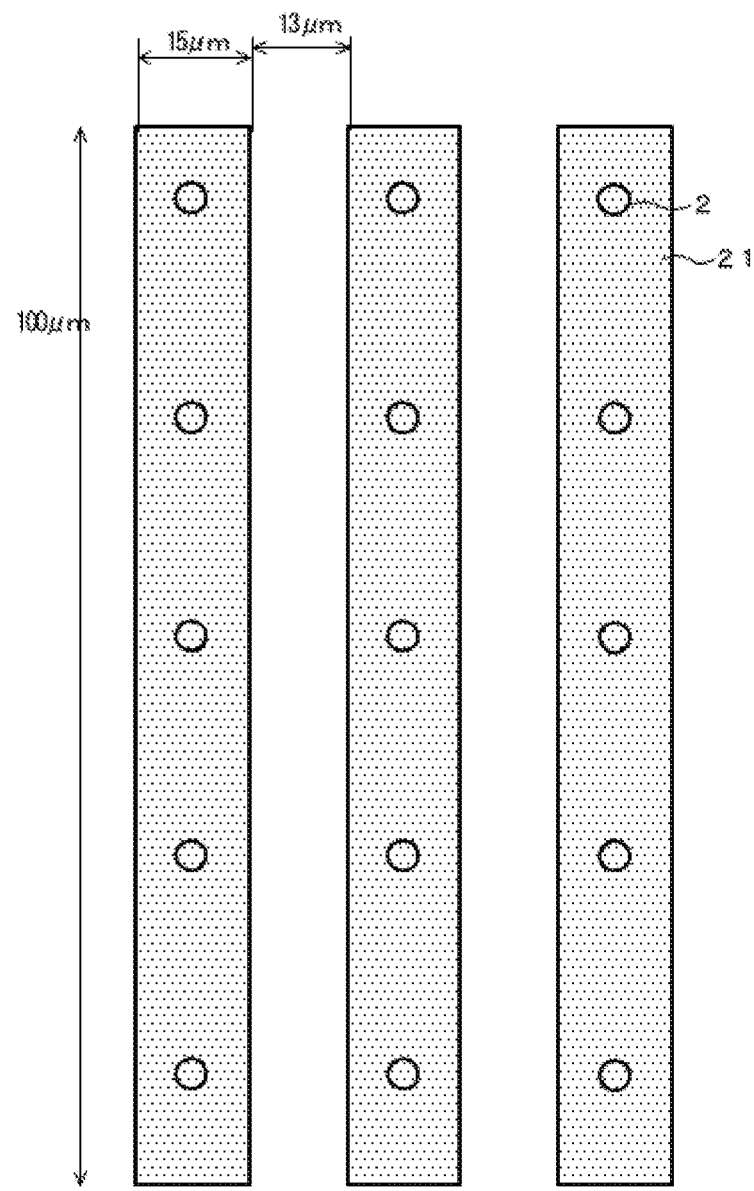
FIG. 12 is a disposition drawing of conductive particles in an anisotropic conductive film of Comparative Example 2.

|  |  | Comparative Example 1 | Comparative Example 2 | Example 1 | Example 2 |
|---|---|---|---|---|---|
| Disposition Of Conductive Particles | | Random | FIG. 12 | FIG. 7 | FIG. 7 |
| Conductive Particle Arrangement Region Corresponding To Alignment Mark | | Absent | Present | Absent | Present |
| Diameter of Conductive Particles (μm) | | 4 | 4 | 4 | 4 |
| Number Density Of Particles (number/mm$^2$) | | 60000 | 1800 In Region For Forming Bumps | 1900 | 1900 |
| Output Bump (Minimum) | Widthwise Direction Of IC (Lengthwise) (μm) | 15 | 15 | 15 | 15 |
| | Lengthwise Direction Of IC (Shorter-side) (μm) | 100 | 100 | 100 | 100 |
| | Space Between Bumps (μm) | 13 | 13 | 13 | 13 |
| Distance Between Particles | Lengthwise Direction of Film (μm) | — | 5 Particles In Bump | 7 | 7 |
| | Direction Orthogonal To Lengthwise Direction Of Film (μm) | — | | 44 | 44 |
| Inclination Angle Of Arrangement | To Direction Orthogonal To Lengthwise Direction Of Film (°) | — | — | 6.3 | 6.3 |
| Film Alignment | Misalignment | Absent / Present | Absent / Present | Absent / Present | Absent / Present |
| | Amount Of Misalignment (%) | 0 / 50 | 0 / 50 | 0 / 50 | 0 / 50 |
| | State Of Particles On Terminal Before Connection | A / A | A / D | B / C | B / C |
| Conduction | Initial Conduction Property | OK / OK | OK / NG | OK / OK | OK / OK |
| | Conduction Reliability (85° C., 85% RH, 500 hr.) | OK / OK | OK / NG | OK / OK | OK / OK |
| Occurrence Rate Of Short Circuit | | NG | OK | OK | OK |

TABLE 3

Figure 8:
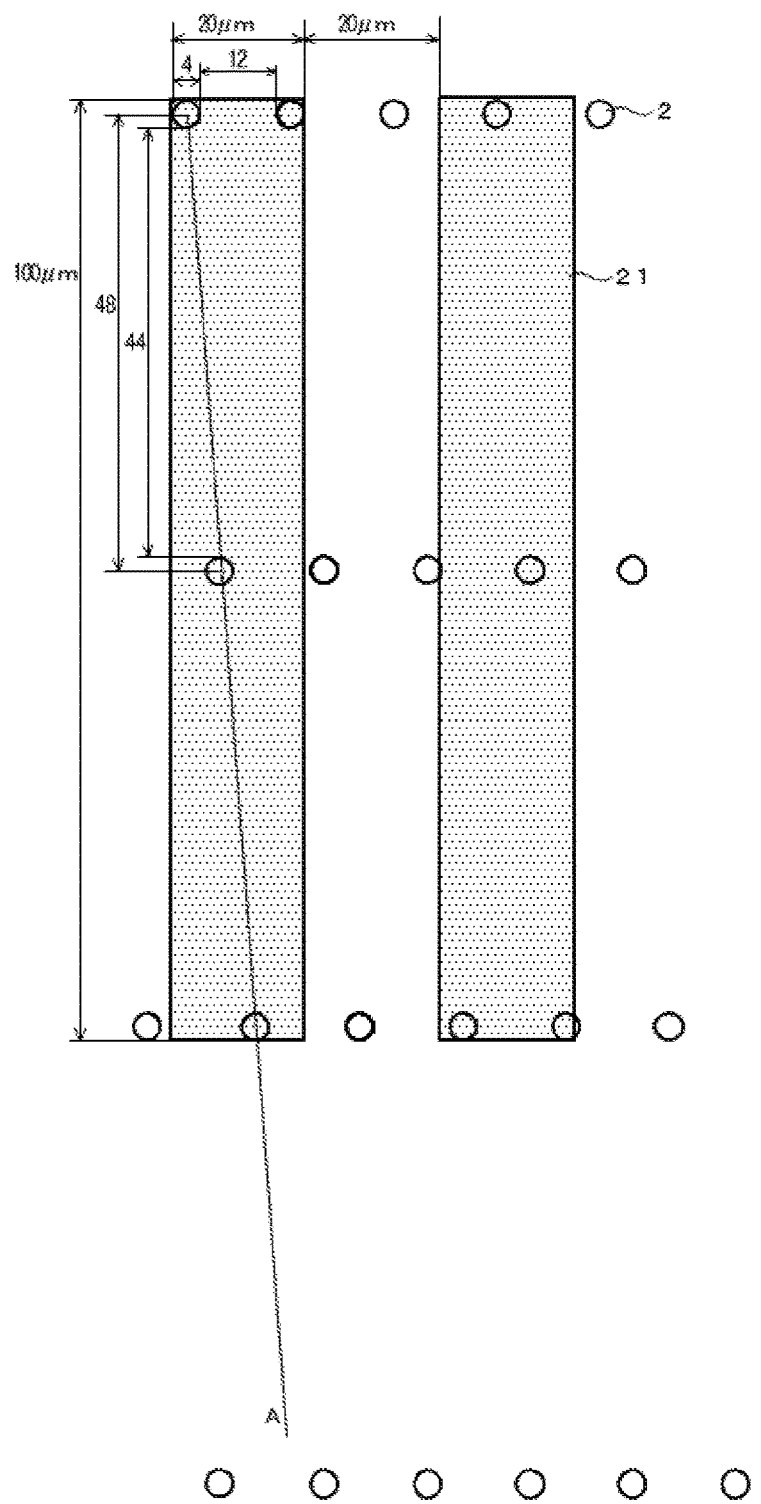
FIG. 8 is a disposition drawing of conductive particles in anisotropic conductive films of Examples 3 and 7.
Figure 9:
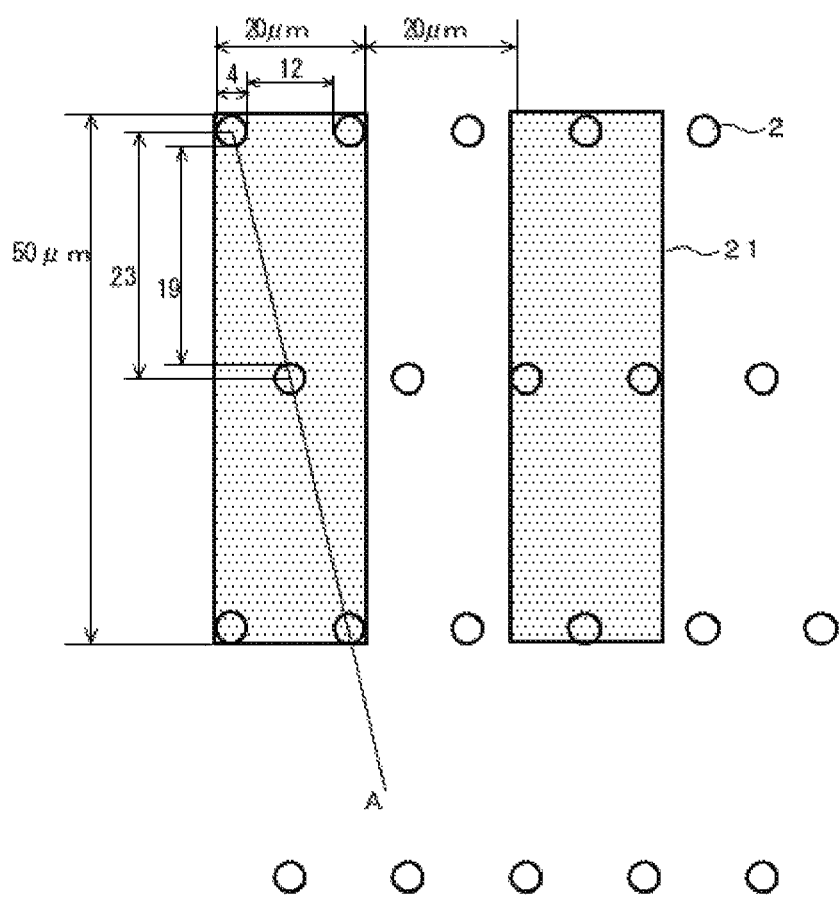
FIG. 9 is a disposition drawing of conductive particles in anisotropic conductive films of Examples 4 and 8.
Figure 10:
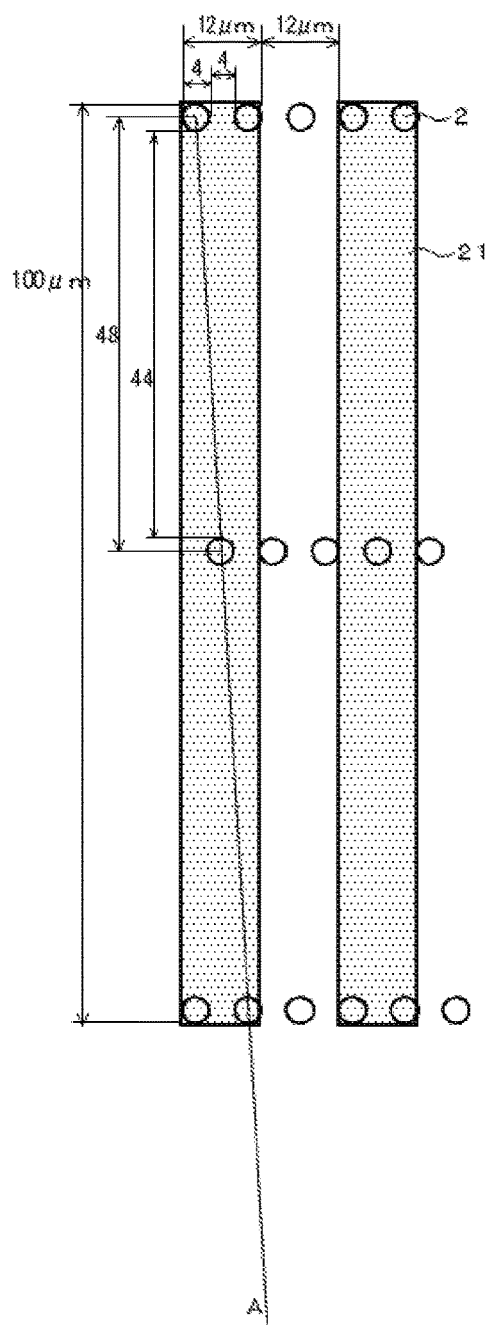
FIG. 10 is a disposition drawing of conductive particles in anisotropic conductive films of Examples 5 and 9.
Figure 11:
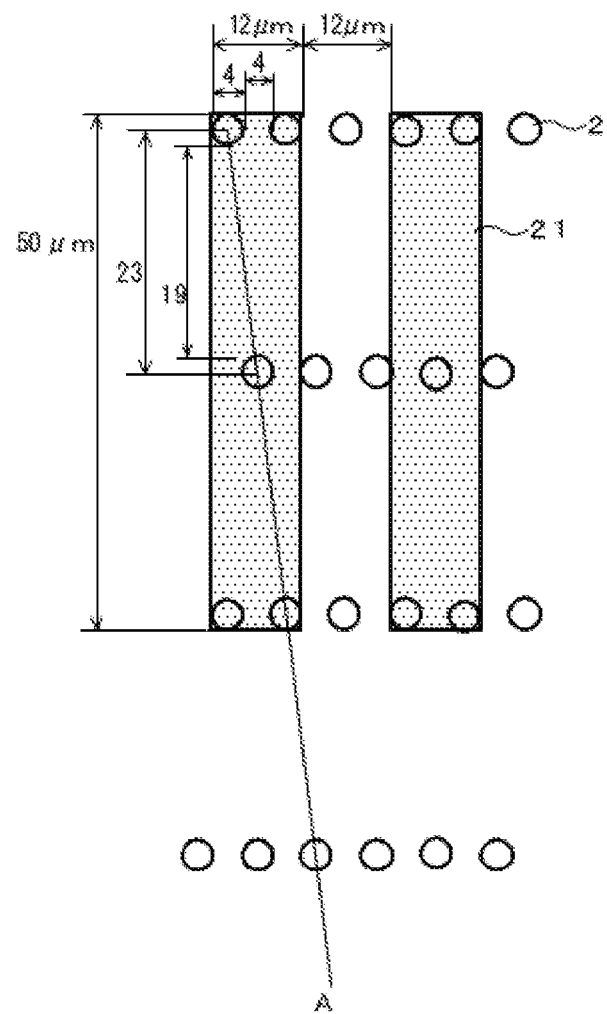
FIG. 11 is a disposition drawing of conductive particles in anisotropic conductive films of Examples 6 and 10.

|  |  | Example 2 | Example 3 | Example 4 | Example 5 | Example 6 |
|---|---|---|---|---|---|---|
| Disposition Of Conductive Particles | | FIG. 7 | FIG. 8 | FIG. 9 | FIG. 10 | FIG. 11 |
| Conductive Particle Arrangement Region Corresponding To Alignment Mark | | Present | Present | Present | Present | Present |
| Diameter of Conductive Particles (μm) | | 4 | 4 | 4 | 4 | 4 |
| Number Density Of Particles (number/mm$^2$) | | 1900 | 1300 | 2700 | 2600 | 5400 |
| Output Bump (Minimum) | Widthwise Direction Of IC (Lengthwise) (μm) | 15 | 20 | 12 | 12 | 12 |
| | Lengthwise Direction Of IC (Shorter-side) (μm) | 100 | 100 | 100 | 100 | 50 |
| | Space Between Bumps (μm) | 13 | 20 | 12 | 12 | 12 |
| Distance Between Particles | Lengthwise Direction of Film (μm) | 7 | 12 | 4 | 4 | 4 |
| | Direction Orthogonal To Lengthwise Direction Of Film (μm) | 44 | 44 | 44 | 44 | 23 |
| Inclination Angle Of Arrangement | To Direction Orthogonal To Lengthwise Direction Of Film (°) | 6.3 | 4.8 | 19.2 | 4.6 | 9.1 |
| Film Alignment | Misalignment | Absent / Present | Absent / Present | Absent / Present | Absent / Present | Absent / Present |
| | Amount Of Misalignment (%) | 0 / 50 | 0 / 50 | 0 / 50 | 0 / 50 | 0 / 50 |
| | State Of Particles On Terminal Before Connection | B / C | C / C | B / B | B / B | B / B |
| Conduction | Initial Conduction Property | OK / OK | OK / OK | OK / OK | OK / OK | OK / OK |
| | Conduction Reliability (85° C., 85% RH, 500 hr.) | OK / OK | OK / OK | OK / OK | OK / OK | OK / OK |
| Occurrence Rate Of Short Circuit | | OK | OK | OK | OK | OK |

TABLE 4

|  |  | Example 7 | Example 8 | Example 9 | Example 10 | Example 11 |
|---|---|---|---|---|---|---|
| Disposition Of Conductive Particles | | FIG. 7 | FIG. 8 | FIG. 9 | FIG. 10 | FIG. 11 |
| Conductive Particle Arrangement Region Corresponding To Alignment Mark | | Absent | Absent | Absent | Absent | Absent |
| Diameter of Conductive Particles (μm) | | 4 | 4 | 4 | 4 | 4 |
| Number Density Of Particles (number/mm$^2$) | | 1900 | 1300 | 2700 | 2600 | 5400 |
| Output Bump (Minimum) | Widthwise Direction Of IC (Lengthwise) (μm) | 15 | 20 | 12 | 12 | 12 |
| | Lengthwise Direction Of IC (Shorter-side) (μm) | 100 | 100 | 100 | 100 | 50 |
| | Space Between Bumps (μm) | 13 | 20 | 12 | 12 | 12 |

TABLE 4-continued

|  |  | Example 7 | | Example 8 | | Example 9 | | Example 10 | | Example 11 | |
| --- | --- | --- | --- | --- | --- | --- | --- | --- | --- | --- | --- |
| Distance Between Particles | Lengthwise Direction of Film (μm) | 7 | | 12 | | 4 | | 4 | | 4 | |
|  | Direction Orthogonal To Lengthwise Direction Of Film (μm) | 44 | | 44 | | 44 | | 44 | | 23 | |
| Inclination Angle Of Arrangement | To Direction Orthogonal To Lengthwise Direction Of Film (°) | 6.3 | | 4.8 | | 19.2 | | 4.6 | | 9.1 | |
| Film Alignment | Misalignment | Absent | Present | Absent | Present | Absent | Present | Absent | Present | Absent | Present |
|  | Amount Of Misalignment (%) | 0 | 50 | 0 | 50 | 0 | 50 | 0 | 50 | 0 | 50 |
| State Of Particles On Terminal Before Connection | | B | C | C | C | B | B | B | B | B | B |
| Conduction | Initial Conduction Property | OK | OK | OK | OK | OK | OK | OK | OK | OK | OK |
|  | Conduction Reliability (85° C., 85% RH, 500 hr.) | OK | OK | OK | OK | OK | OK | OK | OK | OK | OK |
| Occurrence Rate Of Short Circuit | | OK | | OK | | OK | | OK | | OK | |

From Tables 2 to 4, the anisotropic conductive films of Examples 1 to 11 in which the conductive particles are disposed such that 4 to 5 conductive particles are present per bump have a good conduction property not only when the film has no misalignment but also when 50% or more misalignment is present in spite of their low particle number densities of the conductive particles at a few thousand particles/mm$^2$.

In Examples 3 and 8, an inclination angle in the lengthwise direction of the bump and a particle pitch in the width direction of the bump in FIG. 8 are adjusted as an example in which the conductive particles are displaced at positions other than the corners of the bump. Specifically, the conductive particle at the upper left corner of the bump in the figure and the conductive particle immediately at the lower right have a disposition of the conductive particles displaced by an amount 1.4 times the particle diameter in the widthwise direction of the bump. Since Examples 3 and 8 have results comparable to the other examples, it can be seen that the number of captures is stabilized even when the film is displaced in the lengthwise direction of the film.

In Comparative Example 1, in contrast, while the conduction property is good regardless of the presence or absence of misalignment, the occurrence rate of a short circuit is bad due to the high particle number density. Accordingly, the production cost of the anisotropic conductive film is increased.

In Comparative Example 2, due to its parallel arrangement to the terminals, a good conduction property can be obtained with a relatively low particle number density when there is no misalignment. When misalignment is present, however, it can be seen that the conduction property is deteriorated drastically.

Moreover, evaluations were made on Comparative Example 2 in the same manner except that the film was bonded so as to be displaced in the shorter-side direction of the film (the lengthwise direction of the terminal) by 50% of the terminal length while keeping misalignment in the lengthwise direction of the film at 0%. As a result, the connection failed even when the misalignment in the lengthwise direction of the film was 0%.

Next, evaluations were made on Examples 1 to 11 in the same manner except that the film was bonded so as to be displaced in the shorter-side direction of the film (the lengthwise direction of the terminal) by 50% of the terminal length while keeping misalignment in the lengthwise direction of the film at 0%, as with the above. A minimum level of conduction performance was obtained. The minimum level of conduction performance was obtained also when the film was further displaced in the lengthwise direction of the film (the shorter-side direction of the terminal) by 50%.

As a result of comparison between the anisotropic conductive films including the conductive particle formed region corresponding to the alignment mark (Examples 2 to 6) and the anisotropic conductive films including no conductive particle formed region corresponding to the alignment mark (Examples 7 to 11), equivalent anisotropic connection performance was obtained regardless of the presence or absence of the alignment mark. That is, approximately the same results were obtained except that an amount of time required for temporarily bonding the anisotropic conductive film to the glass substrate was slightly prolonged. While the temporary bonding of the film to the glass substrate was manually performed in the examples, temporary bonding is performed by a mechanical operation in the anisotropic connection in a production line. Thus, the presence or absence of the alignment mark creates no particular problem in the production line.

Anisotropic conductive films of Examples 12 to 22 were obtained in the same manner except that a mold was made such that 90% of the distance between the bump rows in the IC chip became a buffer region in the arrangement patterns of Examples 1 to 11. Evaluations were made when the film was displaced in the widthwise direction of the film by 0% and 50%. Results approximately equivalent to Examples 1 to 11 were obtained.

REFERENCE SIGNS LIST 1A, 1B, 1C, 1D anisotropic conductive film
2, 2a, 2b, 2c conductive particle
3a, 3b arrangement region of conductive particles
4 buffer region
5 conductive particle arrangement region corresponding to alignment mark
10 insulating adhesive layer
20 IC chip, electronic component
21 output-side terminal, bump
22a, 22b corner of output-side terminal, end portion
24 input-side terminal, bump
25 side terminal
A1, A2 arrangement axis
D particle diameter
L1 terminal length
L2 terminal width
L3 diagonal length of terminal
L4 distance between terminals
L5 diagonal length of rectangle of one pitch by terminal length L1

P1 particle pitch
P2 axis pitch
θ angle of arrangement axis to widthwise direction of film (inclination angle)

The invention claimed is:

1. An anisotropic conductive film comprising an insulating adhesive layer, and conductive particles disposed on the insulating adhesive layer, wherein arrangement axes of the conductive particles having a predetermined particle pitch extend in approximately a widthwise direction of the anisotropic conductive film, and the arrangement axes are sequentially arranged with a predetermined axis pitch in a lengthwise direction of the anisotropic conductive film, and a particle pitch in the arrangement axes, an axis pitch of the arrangement axes, and an angle of the arrangement axes relative to the widthwise direction of the anisotropic conductive film (hereinafter, referred to as an inclination angle of the arrangement axes) are determined according to external shapes of terminals of an electronic component such that 3 to 40 conductive particles are present on each of the terminals when a terminal arrangement region of the electronic component to be connected with the anisotropic conductive film is superimposed on the anisotropic conductive film such that a lengthwise direction of each of the terminals is aligned with the widthwise direction of the anisotropic conductive film.

2. The anisotropic conductive film according to claim 1, wherein, when the electronic component to be connected with the anisotropic conductive film has a plurality of terminal arrangement regions having different arrangement pitches, the particle pitch in the arrangement axes, the axis pitch of the arrangement axes, and the inclination angle of the arrangement axes are determined according to an external shape of a terminal having a minimum width or area among the terminals contained in the plurality of terminal arrangement regions.

3. The anisotropic conductive film according to claim 1, wherein the arrangement axes have the particle pitch and the inclination angle of the arrangement axes such that three or more conductive particles are present in one terminal, and each of the terminals is traversed by three or more arrangement axes.

4. The anisotropic conductive film according to claim 1, wherein a plurality of rows of arrangement regions of the conductive particles are formed in the lengthwise direction of the anisotropic conductive film corresponding to an external shape of the terminal arrangement region of the electronic component to be connected with the anisotropic conductive film.

5. The anisotropic conductive film according to claim 1, wherein arrangement regions of the conductive particles, corresponding to an external shape of an alignment mark of the electronic component, are formed periodically in the lengthwise direction of the anisotropic conductive film.

6. The anisotropic conductive film according to claim 1, wherein a plurality of types of arrangement axes having different inclination angles are present as the arrangement axes of the conductive particles.

7. An anisotropic conductive film comprising an insulating adhesive layer, and conductive particles disposed on the insulating adhesive layer, wherein in an arbitrarily selected region having a length of 5 to 400 µm in a lengthwise direction of the anisotropic conductive film and a width equal to a film width, 3 to 3,200 conductive particles are present, and in the arbitrarily selected region, arrangement axes of the conductive particles having a predetermined particle pitch obliquely intersect with a widthwise direction of the anisotropic conductive film, and the arrangement axes are arranged side by side in the lengthwise direction of the anisotropic conductive film.

8. The anisotropic conductive film according to claim 7, wherein arrangement axes having different inclination angles are present as the arrangement axes of the conductive particles.

9. A connection structure comprising a first electronic component and a second electronic component connected by anisotropic conductive connection with the anisotropic conductive film according to claim 1.

10. A method of manufacturing a connection structure comprising connecting a first electronic component and a second electronic component by anisotropic conductive connection with the anisotropic conductive film according to claim 1.

* * * * *